United States Patent
Ishiguro et al.

(10) Patent No.: US 9,269,799 B2
(45) Date of Patent: Feb. 23, 2016

(54) SEMICONDUCTOR APPARATUS

(71) Applicant: FUJITSU LIMITED, Kawasaki-shi, Kanagawa (JP)

(72) Inventors: Tetsuro Ishiguro, Kawasaki (JP); Atsushi Yamada, Isehara (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/952,827

(22) Filed: Jul. 29, 2013

(65) Prior Publication Data

US 2014/0091318 A1    Apr. 3, 2014

(30) Foreign Application Priority Data

Sep. 28, 2012 (JP) .................. 2012-218249

(51) Int. Cl.
*H01L 27/00* (2006.01)
*H01L 29/778* (2006.01)
*H01L 29/20* (2006.01)
*H01L 29/423* (2006.01)
*H01L 29/66* (2006.01)
(Continued)

(52) U.S. Cl.
CPC ............. *H01L 29/778* (2013.01); *B82Y 10/00* (2013.01); *H01L 29/1075* (2013.01); *H01L 29/15* (2013.01); *H01L 29/2003* (2013.01); *H01L 29/42372* (2013.01); *H01L 29/66462* (2013.01); *H01L 29/7787* (2013.01)

(58) Field of Classification Search
CPC ... H01L 21/02507; H01L 33/04; H01L 33/12; H01L 21/02381; H01L 21/02458; H01L 21/02491; H01L 21/0254; H01L 29/155; H01L 29/2003; H01L 33/007; H01L 33/012; C30B 29/68
See application file for complete search history.

(56) References Cited

U.S. PATENT DOCUMENTS 6,177,685 B1 * 1/2001 Teraguchi et al. ............. 257/20
2006/0159198 A1 * 7/2006 Morimoto et al. ........... 375/297
(Continued)

FOREIGN PATENT DOCUMENTS

CN    1917231 A    2/2007
CN    102598316 A    7/2012
(Continued)

OTHER PUBLICATIONS

"Presentation of publications and the like" of Japanese Patent Application No. 2012-218249 dated Jul. 28, 2015. Translation of the relevant part of the document.
(Continued)

*Primary Examiner* — Victor A Mandala
*Assistant Examiner* — Quovaunda V Jefferson
(74) *Attorney, Agent, or Firm* — Kratz, Quintos & Hanson, LLP

(57) ABSTRACT

A semiconductor apparatus includes: a substrate; a buffer layer formed on the substrate; a strained layer superlattice buffer layer formed on the buffer layer; an electron transit layer formed of a semiconductor material on the strained layer superlattice buffer layer; and an electron supply layer formed of a semiconductor material on the electron transit layer; the strained layer superlattice buffer layer being an alternate stack of first lattice layers including AlN and second lattice layers including GaN; the strained layer superlattice buffer layer being doped with one, or two or more impurities selected from Fe, Mg and C.

20 Claims, 11 Drawing Sheets

(51) Int. Cl.
 *H01L 29/10* (2006.01)
 *H01L 29/15* (2006.01)
 *B82Y 10/00* (2011.01)

(56) References Cited

U.S. PATENT DOCUMENTS

2007/0051978 A1* 3/2007 Mita et al. .................... 257/194
2011/0062556 A1   3/2011 Komiyama et al.
2011/0272665 A1* 11/2011 Yamaguchi et al. ............ 257/12
2012/0175589 A1*  7/2012 Ooshika et al. ................ 257/13
2012/0223328 A1*  9/2012 Ikuta et al. .................... 257/76
2012/0273759 A1  11/2012 Ikuta et al.

FOREIGN PATENT DOCUMENTS

JP  2002-359256 A1  12/2002
JP  2007-67077 A1    3/2007
JP  4519196 B2        8/2010
JP  2011082494 A     4/2011
JP  2012-23314 A1    2/2012

OTHER PUBLICATIONS

Office Action of corresponding Chinese Patent Application No. 201310349467.2 dated Nov. 26, 2015, with full translation of the Office Action.

* cited by examiner

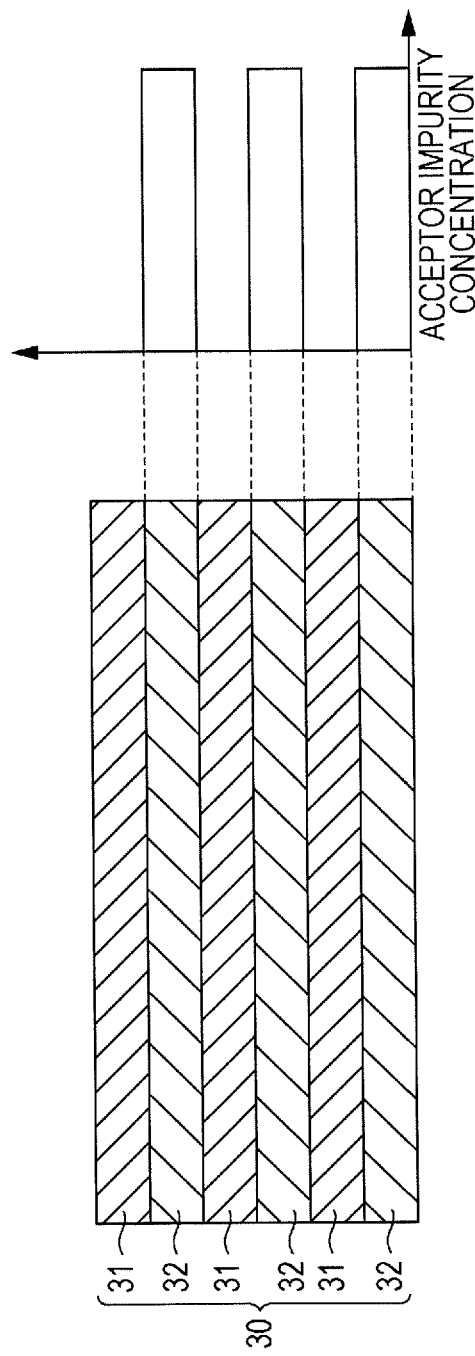

SEMICONDUCTOR APPARATUS

CROSS-REFERENCE TO RELATED APPLICATION

This application is based upon and claims the benefit of priority of the prior Japanese Patent Application No. 2012-218249, filed on Sep. 28, 2012, the entire contents of which are incorporated herein by reference.

FIELD

The embodiments discussed herein are related to semiconductor apparatuses.

BACKGROUND

Nitride semiconductors such as GaN, AlN and InN, as well as mixed crystals thereof have wide band gap and are used in devices such as high-power electronic devices or short-wavelength emitting devices. Of such devices, technical developments of high-power devices have been made with respect to field-effect transistors (FETs), in particular high electron mobility transistors (HEMTs) (for example, Japanese Laid-open Patent Publication No. 2002-359256). These nitride semiconductor HEMTs are used in devices such as high-power and high-efficiency amplifiers and high-power switching devices.

In a nitride semiconductor HEMT, an aluminum gallium nitride/gallium nitride (AlGaN/GaN) heterostructure is disposed on a substrate, the GaN layer functioning as an electron transit layer. The substrates used are those such as sapphire, silicon carbide (SiC), gallium nitride (GaN) and silicon (Si).

GaN is a nitride semiconductor which has high saturated electron velocity and wide band gap, and is capable of high withstand voltage characteristics, thus exhibiting excellent electrical characteristics. Further, because the GaN crystal is a wurtzite structure, the crystal has a polarity in (0001) direction that is parallel to the c axis. In an AlGaN/GaN heterostructure, piezoelectric polarization is induced in the AlGaN layer due to lattice strain between AlGaN and GaN. As a result, a two-dimensional electron gas (2DEG) is formed with a high concentration in the vicinity of the interface, which provides a channel. Thus, GaN HEMTs have promising use in high-frequency and high-power devices.

The costs of nitride semiconductor HEMTs may be greatly reduced by using inexpensive and large silicon substrates. The use of such substrates allows for an inexpensive supply of nitride semiconductor HEMTs. Silicon substrates have electrical conductivity. Thus, the use of a silicon substrate involves a nitride layer with high insulating properties that is formed on the silicon substrate. Nitride semiconductor layers such as an electron transit layer are formed on this nitride film. Due to the differences in lattice constants and thermal expansion coefficients between silicon and the nitrides, however, warps and cracks tend to occur in the substrates and the nitride semiconductor layers, and it is difficult to form a thick nitride layer having high insulating properties. Consequently, high leakage current easily flows in the substrate-gate direction. Thus, it has been difficult to ensure withstand voltage in a vertical direction, namely, to ensure sufficient withstand voltage in the direction of thickness of the substrate.

A strained layer superlattice (SLS) buffer in which GaN thin films and AlN thin films form a periodic alternating structure is an approach that allows for forming nitride layers with large thickness on a silicon substrate while reducing the occurrence of warps and cracks (for example, Japanese Laid-open Patent Publications Nos. 2012-23314 and 2007-67077).

In an SLS buffer layer, GaN thin films and AlN thin films form the strained layer superlattices with film thicknesses which are not more than the critical film thicknesses so as to reduce the occurrence of cracks during film production due to different lattice constants.

As a result, nitride layers may be formed with large thickness. Further, an SLS buffer layer includes large compressive strain within the films of the SLS buffer layer so as to cancel strong compressive strain which occurs in the entirety of the nitride layers during the cooling process after film production, thereby reducing the occurrence of warps and cracks. In this manner, the formation of an SLS buffer layer makes it possible to form AlN having wide band gap and high insulating properties with effectively large thickness, and thereby makes it possible to increase the withstand voltage in a vertical direction.

However, it is often the case that leakage current flows and desired withstand voltage may not be obtained by simply forming the conventional SLS buffer layers.

SUMMARY

According to an aspect of the invention, a semiconductor apparatus includes: a substrate; a buffer layer formed on the substrate; a strained layer superlattice buffer layer formed on the buffer layer; an electron transit layer formed of a semiconductor material on the strained layer superlattice buffer layer; and an electron supply layer formed of a semiconductor material on the electron transit layer; the strained layer superlattice buffer layer being an alternate stack of first lattice layers including AlN and second lattice layers including GaN; the strained layer superlattice buffer layer being doped with one, or two or more impurities selected from Fe, Mg and C.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a view explaining an SLS buffer layer in a semiconductor apparatus according to a second embodiment;

DESCRIPTION OF EMBODIMENTS

Embodiments are described hereinbelow. Identical members and configurations are assigned with identical reference signs and are not described anew.

First Embodiment

Semiconductor Apparatuses

Semiconductor apparatuses in a first embodiment will be described. Semiconductor apparatuses in the present embodiment are HEMTs with an AlGaN/GaN single heterostructure.

Figure 1:
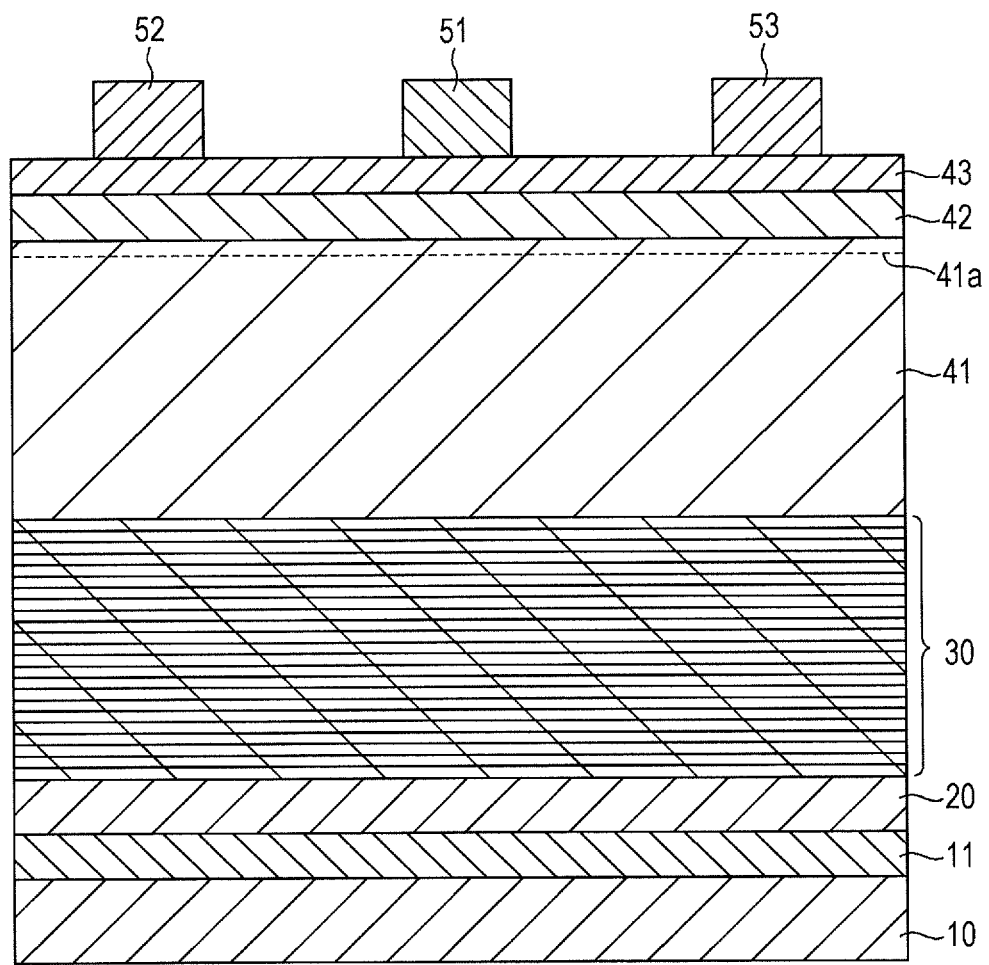
FIG. 1 is a view illustrating a structure of a semiconductor apparatus in a first embodiment.

As illustrated in FIG. 1, a semiconductor apparatus in the present embodiment includes a substrate 10 and nitride layers formed sequentially on the substrate such as a nucleation layer 11, a buffer layer 20, an SLS buffer layer 30, an electron transit layer 41, an electron supply layer 42 and a cap layer 43. On the cap layer 43, a gate electrode 51, a source electrode 52 and a drain electrode 53 are formed.

The substrate 10 may be any of those substrates such as Si, SiC, sapphire and GaN. In the present embodiment, a Si (111) substrate is used. The nitride layers such as the nucleation layer 11, the buffer layer 20, the SLS buffer layer 30, the electron transit layer 41, the electron supply layer 42 and the cap layer 43 are formed by metal organic vapor phase epitaxy (MOVPE) or molecular beam epitaxy (MBE). In the present embodiment, the nitride layers such as the nucleation layer 11, the buffer layer 20, the SLS buffer layer 30, the electron transit layer 41, the electron supply layer 42 and the cap layer 43 are formed by MOVPE.

The nucleation layer 11 is formed of AlN having a thickness of about 200 nm.

The buffer layer 20 is formed of $Al_{0.5}Ga_{0.5}N$ with a thickness of 500 to 1000 nm. In the present embodiment, the buffer layer 20 is formed with a thickness of about 500 nm. In FIG. 1, the buffer layer 20 is illustrated as a single layer having a single composition. However, the buffer layer 20 may be composed of a plurality of layers having different Al compositions. In this case, the layers are formed such that a layer on the SLS buffer layer 30 side has a lower Al composition than in a layer on the nucleation layer 11 side.

For example, the buffer layer 20 may be composed of three layers having different Al compositions. That is, a first buffer layer, a second buffer layer and a third buffer layer may be formed sequentially on the nucleation layer 11. In this case, provided that the composition of the first buffer layer is $Al_xGa_{1-x}N$, the composition of the second buffer layer is $Al_yGa_{1-y}N$, and the composition of the third buffer layer is $Al_zGa_{1-z}N$, these layers are formed so as to satisfy the relationship $1>X>Y>Z>0$. In detail, the first buffer layer is $Al_{0.8}Ga_{0.2}N$, the second buffer layer is $Al_{0.6}Ga_{0.4}N$, and the third buffer layer is $Al_{0.4}Ga_{0.6}N$. In this manner, the first buffer layer, the second buffer layer and the third buffer layer are formed such that the Al composition decreases with increasing distance from the substrate 10. In the present embodiment, the Al composition indicates the ratio of Al atoms relative to the total of Al atoms and Ga atoms in AlGaN. The above values X, Y and Z correspond to the Al compositions.

Figure 2:
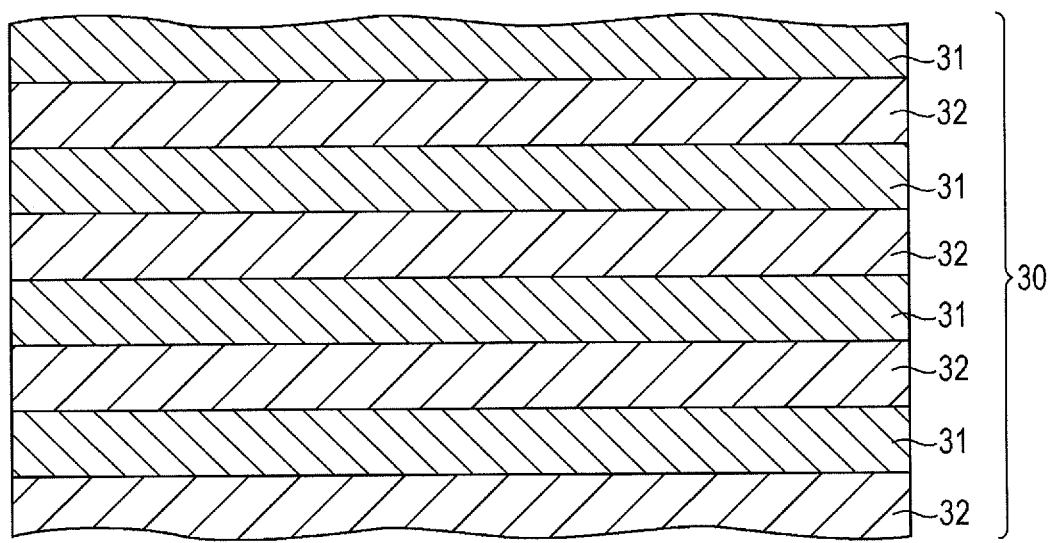
FIG. 2 is a view illustrating a structure of an SLS buffer layer.

As illustrated in FIG. 2, the SLS buffer layer 30 is formed by alternately stacking AlN layers as first lattice layers 31, and GaN layers as second lattice layers 32. AlN and GaN have different lattice constants, with the lattice constants of AlN being a=3.11 Å and c=4.98 Å, and those of GaN being a=3.16 Å and c=5.16 Å.

In the present embodiment, the first lattice layer 31 is formed with a thickness of not less than 0.5 nm and not more than 10 nm, and the second lattice layer 32 is formed with a thickness of not less than 10 nm and not more than 40 nm. The ratio of the thickness of the second lattice layer 32 to the thickness of the first lattice layer 31 is not less than 4 and not more than 20. Here, the effective Al composition in the SLS buffer layer 30 is defined as the ratio of Al present in the SLS buffer layer 30, namely, the number of Al atoms relative to the total of the number of Al atoms and that of Ga atoms. In the present embodiment, the effective composition in the SLS buffer layer 30 is sometimes described as $Al_PGa_{1-P}N$ for convenience wherein P is the ratio of the thickness of the first lattice layers 31 to the total of the thickness of the first lattice layers 31 and the thickness of the second lattice layers 32.

In the present embodiment, the SLS buffer layer 30 is an alternate stack of 100 periods of 5 nm AlN layers as the first lattice layers 31 and 10 nm GaN layers as the second lattice layers 32. As a result, the SLS buffer layer 30 has a thickness of 1500 nm, and the accumulated thickness of the AlN layers present in the SLS buffer layer 30 is 500 nm. In this case, the effective composition in the SLS buffer layer 30 is $Al_{0.33}Ga_{0.67}N$, and the effective Al composition in the SLS buffer layer 30 is about 0.33.

If the SLS buffer layer 30 is excessively thin, the accumulated thickness of the nitride layers with high insulating properties becomes disadvantageously small. If the SLS buffer layer 30 is excessively thick, the substrate 10 may be broken due to film shrinkage in the SLS buffer layer 30 during cooling after film production. Thus, the thickness of the SLS buffer layer 30 is preferably not less than 1000 nm and not more than 3000 nm.

In the present embodiment, the Al composition in the buffer layer 20 is not less than the effective Al composition in the SLS buffer layer 30. That is, in the above case, the Al composition in the buffer layer 20 is not less than 0.33.

In the case where the buffer layer 20 is formed of a plurality of layers having different Al compositions, these layers are formed such that the Al composition in the uppermost layer in contact with the SLS buffer layer 30 is not less than the effective Al composition in the SLS buffer layer 30. For example, when the buffer layer 20 is formed of three layers having different Al compositions as described above, the layers are formed such that the Al composition in the third buffer layer is not less than the effective Al composition in the SLS buffer layer 30, that is, $Z \geq P > 0$.

The first lattice layers 31 and the second lattice layers 32 may be AlGaN layers having different compositions from each other. In this case, the layers are formed so as to satisfy the relationship $R>S$ provided that the composition of the first lattice layers 31 is $Al_RGa_{1-R}N$ and the composition of the second lattice layers 32 is $Al_SGa_{1-S}N$.

Figure 3:
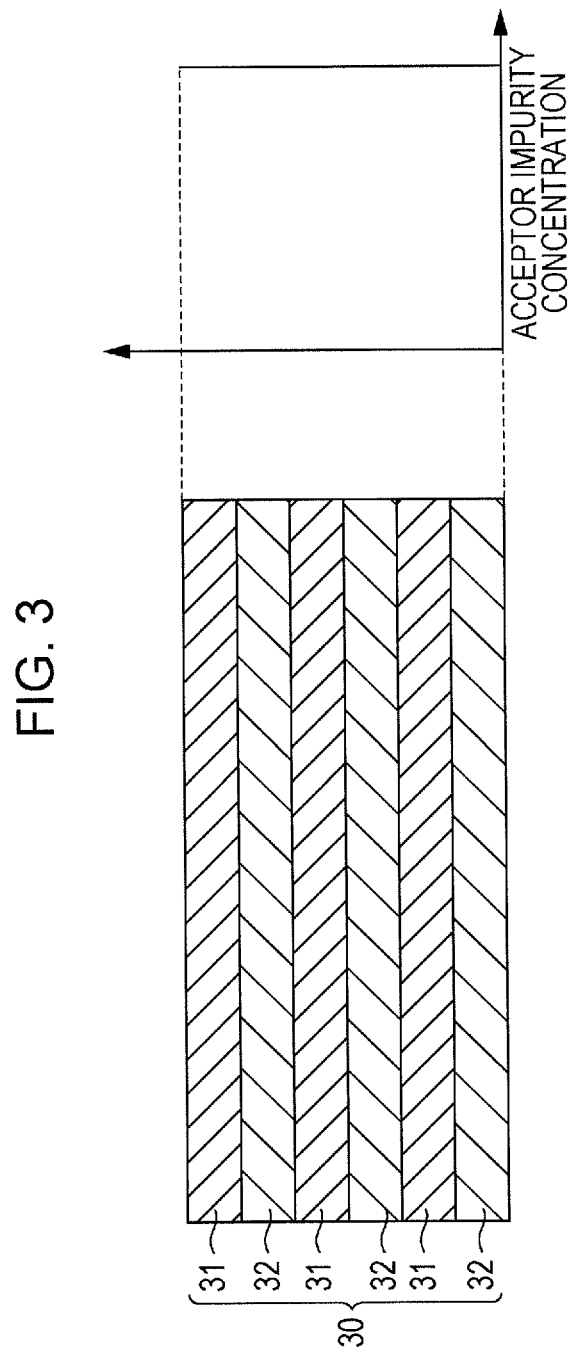
FIG. 3 is a view explaining an SLS buffer layer in a semiconductor apparatus according to the first embodiment.

In the present embodiment, the SLS buffer layer 30 is doped with impurities such as Fe, Mg and C in order to reduce the generation of carriers in the SLS buffer layer 30 and to increase the resistance. In detail, as illustrated in FIG. 3, the SLS buffer layer 30 is doped with impurities in the entirety of the SLS buffer layer 30. In view of the diffusion to the vicinity of the channel, the concentration of dopant impurities such as Fe, Mg and C in the SLS buffer layer 30 is preferably $1\times10^{18}$ $cm^{-3}$ to $1\times10^{20}$ $cm^{-3}$. In the present embodiment, the SLS buffer layer 30 is doped with $1\times10^{19}$ $cm^{-3}$ of Fe as the impurity.

The electron transit layer 41 is formed of GaN with a thickness of 500 to 1000 nm, and the electron supply layer 42 is formed of AlGaN with a thickness of about 20 nm. With this configuration, a 2DEG 41a is formed in the electron transit layer 41 in the vicinity of the interface between the electron transit layer 41 and the electron supply layer 42. In order to reduce a decrease in crystallinity due to lattice mismatch, the electron supply layer 42 is formed of AlGaN having an Al composition of not more than 0.3. The cap layer 43 is formed of n-GaN with a thickness of about 5 nm.

On the cap layer 43, the gate electrode 51, the source electrode 52 and the drain electrode 53 are formed.

In the present embodiment, doping of the SLS buffer layer 30 with impurities such as Fe increases the resistance of the SLS buffer layer 30 and consequently reduces the occurrence of leakage current in the substrate-gate direction.

(Characteristics of Semiconductor Apparatuses and Related Products)

Figure 4:
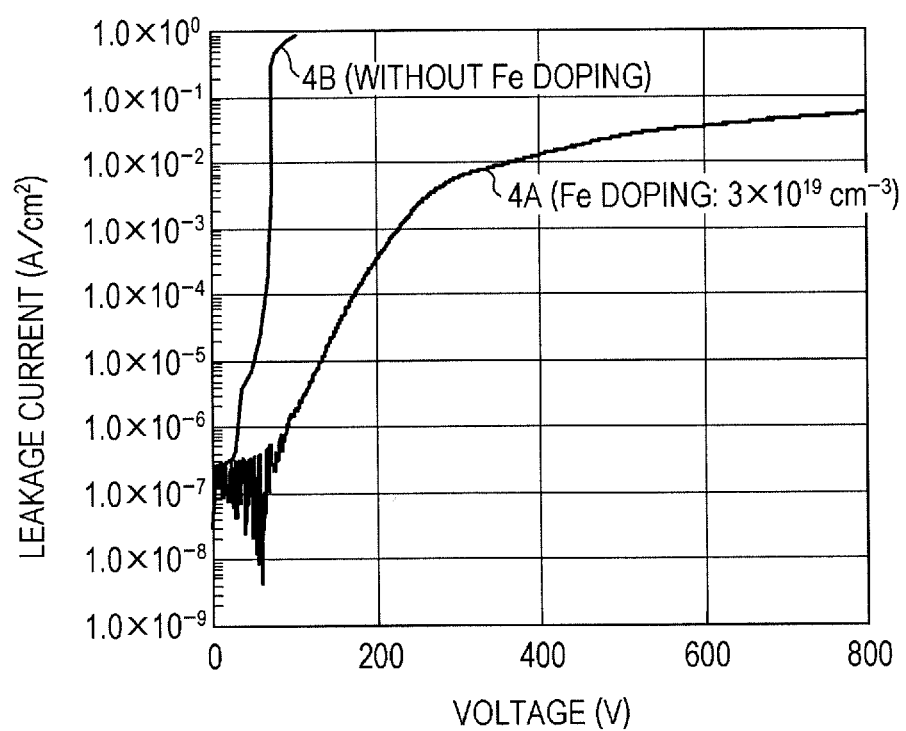
FIG. 4 is a diagram illustrating leakage current characteristics in the substrate-gate direction.

Next, leakage current in a semiconductor apparatus in the present embodiment will be described with reference to FIG. 4. FIG. 4 indicates a leakage current characteristic 4A of a unit having nitride layers according to the present embodiment, and a leakage current characteristic 4B of a unit having conventional nitride layers.

Figure 5A:
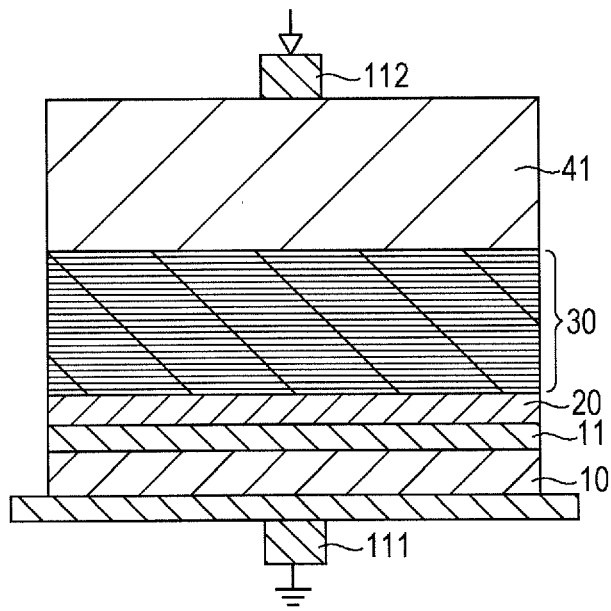
FIGS. 5A and 5B are views illustrating units produced for the measurement of leakage current characteristics illustrated in FIG. 4.

The leakage current characteristic 4A of a unit having nitride layers according to the present embodiment is a leakage current characteristic of a unit illustrated in FIG. 5A in which an SLS buffer layer 30 is doped with impurities such as Fe. In detail, a nucleation layer 11, a buffer layer 20, an SLS buffer layer 30 and an electron transit layer 41 are stacked on a substrate 10, and an electrode 111 and an electrode 112 are placed into contact with the backside of the substrate 10 and with the electron transit layer 41, respectively, thereby measuring the leakage current characteristic. The substrate 10 is a silicon substrate. The nucleation layer 11 is formed of AlN with a thickness of 200 nm. The buffer layer 20 is formed of $Al_{0.3}Ga_{0.7}N$ with a thickness of 500 nm. The SLS buffer layer 30 is an alternate stack of 90 periods of 2 nm AlN layers as first lattice layers 31 and 20 nm GaN layers as second lattice layers 32. As a result, the SLS buffer layer 30 has a thickness of about 2000 nm. The SLS buffer layer 30 is doped with $3\times10^{19}$ cm$^{-3}$ of Fe as the impurity. The electron transit layer 41 is formed of GaN with a thickness of 1200 nm. The electrode 111 is placed in contact with the backside of the substrate 10 of this stack, and the electrode 112 is placed in contact with the top surface of the electron transit layer 41. A voltage is applied between the electrodes 111 and 112 to measure leakage current. The result is illustrated as the leakage current characteristic 4A in FIG. 4.

Figure 5B:
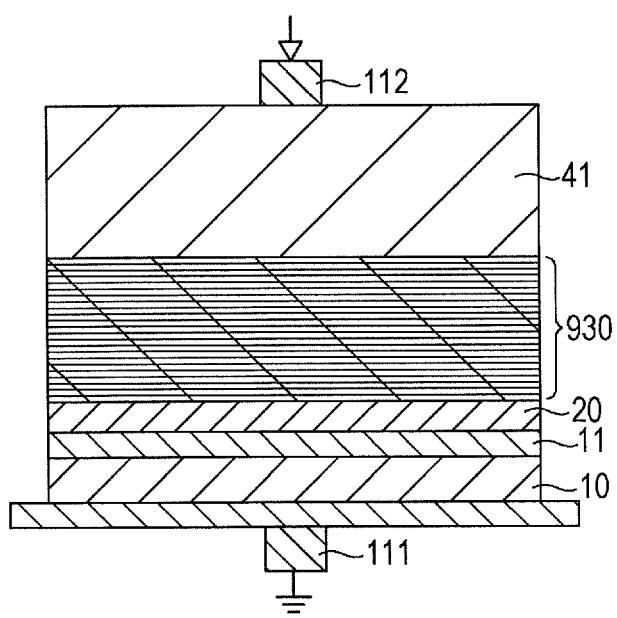

The leakage current characteristic 4B of a unit having conventional nitride layers is a leakage current characteristic of a unit illustrated in FIG. 5B in which an SLS buffer layer 930 is formed without being doped with impurities such as Fe. In detail, a nucleation layer 11, a buffer layer 20, an SLS buffer layer 930 and an electron transit layer 41 are stacked on a substrate 10, and an electrode 111 and an electrode 112 are placed into contact with the backside of the substrate 10 and with the electron transit layer 41, respectively, thereby measuring the leakage current characteristic. The SLS buffer layer 930 has the same thickness and the same composition as the SLS buffer layer 30 except that this SLS buffer layer 930 is not doped with impurities such as Fe. The electrode 111 is placed in contact with the backside of the substrate 10 of this stack, and the electrode 112 is placed in contact with the top surface of the electron transit layer 41. A voltage is applied between the electrodes 111 and 112 to measure leakage current. The result is illustrated as the leakage current characteristic 4B in FIG. 4.

As illustrated in FIG. 4, the unit having nitride layers according to the present embodiment (the leakage current characteristic 4A) has a lower leakage current at the same voltage than the unit having conventional nitride layers (the leakage current characteristic 4B). Thus, it has been demonstrated that the semiconductor apparatuses in the present embodiment may reduce leakage current in the substrate-gate direction compared to conventional semiconductor apparatuses.

(Methods of Manufacturing Semiconductor Apparatuses)

Next, a method of manufacturing a semiconductor apparatus in the present embodiment will be described with reference to FIG. 6.

Figure 6A:
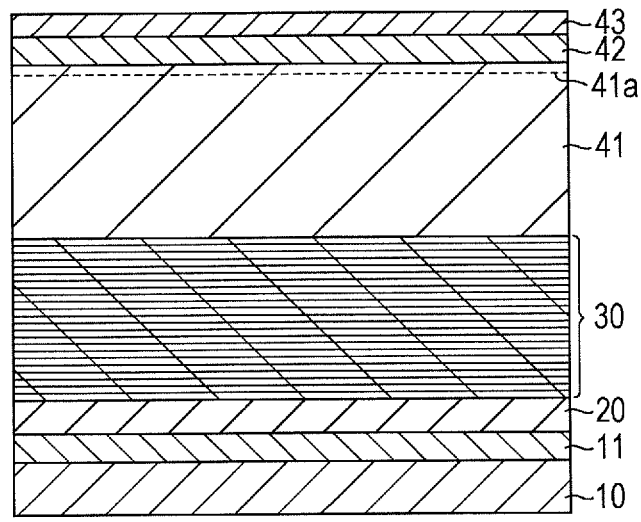
FIGS. 6A and 6B are process drawings illustrating a method of manufacturing a semiconductor apparatus according to the first embodiment.

First, as illustrated in FIG. 6A, a nucleation layer 11, a buffer layer 20, an SLS buffer layer 30, an electron transit layer 41, an electron supply layer 42 and a cap layer 43 are sequentially stacked onto a substrate 10. In detail, first, a substrate 10 is heat treated in a hydrogen atmosphere for several minutes; thereafter, a nucleation layer 11, a buffer layer 20, an SLS buffer layer 30, an electron transit layer 41, an electron supply layer 42 and a cap layer 43 are epitaxially grown by MOVPE on the substrate 10. As a result, a 2DEG 41a is formed in the electron transit layer 41 in the vicinity of the interface between the electron transit layer 41 and the electron supply layer 42.

In the epitaxial growth by MOVPE, trimethylgallium (TMG) is used as a Ga material gas, trimethylaluminum (TMA) as an Al material gas, and ammonia ($NH_3$) as a N material gas. When doping involves Fe as the impurity, cyclopentadienyliron ($Cp_2Fe$), usually ferrocene, is used as an Fe material gas. For doping with Mg as the impurity, cyclopentadienylmagnesium ($Cp_2Mg$) is used as a Mg material gas. The material gas is fed into a chamber of an MOVPE apparatus with hydrogen ($H_2$) as a carrier gas.

The substrate 10 may be formed of a material such as sapphire, Si or SiC. In the present embodiment, for example, a silicon (Si) substrate is used.

The nucleation layer 11 is formed of AlN having a thickness of 100 to 200 nm.

The buffer layer 20 is formed of $Al_{0.5}Ga_{0.5}N$ with a thickness of about 500 nm.

The SLS buffer layer 30 is an alternate stack of 100 periods of 5 nm AlN layers as first lattice layers 31 and 10 nm GaN layers as second lattice layers 32. The SLS buffer layer 30 is doped with impurities such as Fe, Mg and C at a concentration of $1\times10^{18}$ cm$^{-3}$ to $1\times10^{20}$ cm$^{-3}$. In the present embodiment, the SLS buffer layer 30 is doped with $1\times10^{19}$ cm$^{-3}$ of Fe as the impurity.

In this case, when doping involves Fe or Mg as the impurity, a material gas of the impurity is formed by bubbling and is fed into a chamber of an MOVPE apparatus together with TMG or TMA as well as with $NH_3$. When doping involves C as the impurity, the concentration of the dopant C may be controlled by regulating the ratio of the feed amount of $NH_3$ that is a Group V material gas to the feed amount of TMG or TMA that is a Group III material gas (V/III ratio). In detail, the C concentration may be increased by lowering the V/III ratio, namely, by increasing the relative feed amount of the Group III material gas.

The electron transit layer 41 is formed of GaN. In order to reduce a decrease in electron concentration or mobility due to defects such as dislocation, the electron transit layer 41 is preferably formed with at least a specific thickness, for example, with a thickness of 500 to 1000 nm. As the electron transit layer 41, for example, a high-quality GaN film may be formed with a low impurity concentration by an epitaxial growth method under such conditions that the pressure in the chamber of the MOVPE apparatus is not less than 60 kPa and the V/III ratio is not less than 10000.

The electron supply layer 42 is formed of AlGaN with a thickness of about 20 nm. In order to reduce a decrease in crystallinity due to lattice mismatch, the electron supply layer 42 is formed of AlGaN having an Al composition of not more than 0.3.

The cap layer 43 is formed of n-GaN with a thickness of about 5 nm.

Figure 6B:
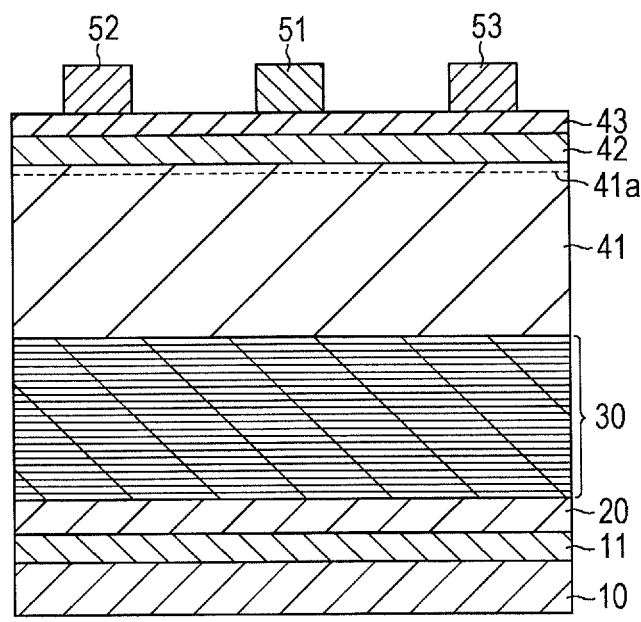

Next, as illustrated in FIG. 6B, a gate electrode 51, a source electrode 52 and a drain electrode 53 are formed on the cap layer 43.

In detail, these electrodes are formed in the following manner. First, a photoresist is applied onto the cap layer 43, and is photoexposed and developed with a photoexposure apparatus to form a resist pattern having openings in regions where the source electrode 52 and the drain electrode 53 are to be produced. Thereafter, a Ti/Al metal stack film (film thicknesses: Ti 100 nm, Al 300 nm) is formed by vacuum deposition, and the unit is immersed in an organic solvent to remove the metal stack film present on the resist pattern by lift off together with the resist pattern. The remaining metal stack film defines the source electrode 52 and the drain electrode 53. Thereafter, these electrodes are subjected to rapid thermal annealing (RTA) at a temperature of about 600° C. to establish an ohmic contact.

Subsequently, a photoresist is applied again onto the cap layer 43, and is photoexposed and developed with a photoexposure apparatus to form a resist pattern having an opening in a region where the gate electrode 51 is to be produced. Thereafter, a Ni/Au metal stack film (film thicknesses: Ni 50 nm, Au 300 nm) is formed by vacuum deposition, and the unit is immersed in an organic solvent to remove the metal stack film present on the resist pattern by lift off together with the resist pattern. The remaining metal stack film defines the gate electrode 51.

In the above manner, a semiconductor apparatus in the present embodiment may be manufactured.

Figure 7A:
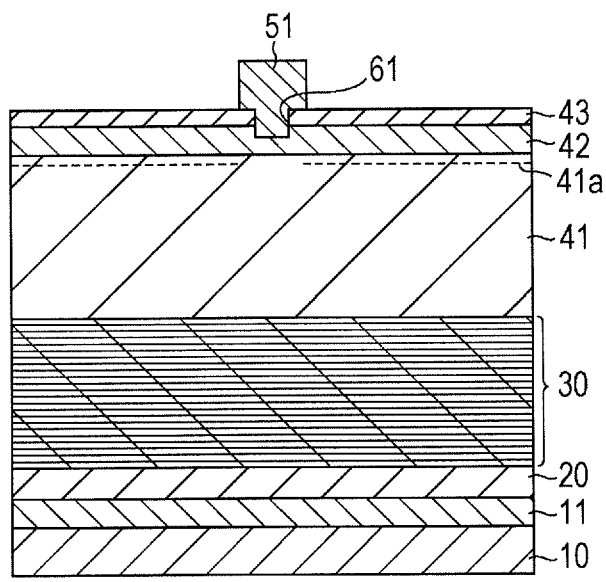
FIGS. 7A and 7B are views illustrating other structures of semiconductor apparatuses according to the first embodiment.
Figure 7B:
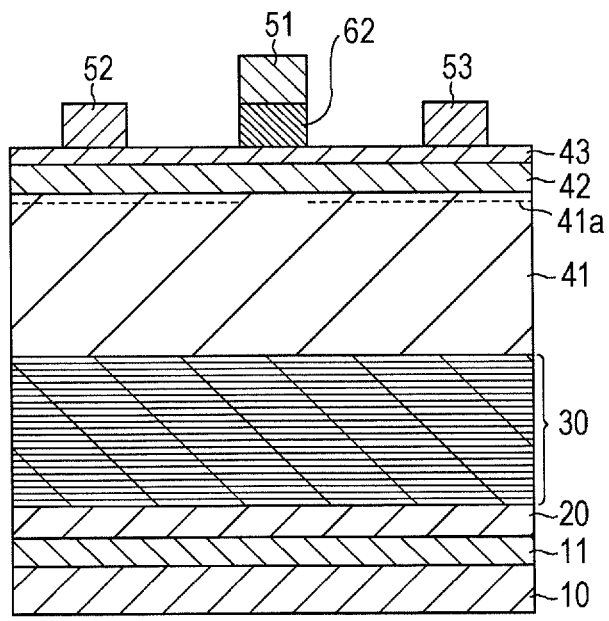

In the present embodiment, as illustrated in FIG. 7A, respective portions of the cap layer 43 and the electron supply layer 42 immediately below the gate electrode 51 may be removed to form a recess 61, and the gate electrode 51 may be formed so as to extend into the recess 61. According to this configuration, there may be no 2DEG 41a immediately below the gate electrode 51 and thus a normally-off operation becomes feasible. Alternatively, as illustrated in FIG. 7B, a p-GaN layer 62 may be formed between the cap layer 43 and the gate electrode 51. With this configuration, similarly, there may be no 2DEG 41a immediately below the gate electrode 51 and thus a normally-off operation becomes feasible.

Second Embodiment

Next, a second embodiment will be described. A semiconductor apparatus in the present embodiment has the same configurations as the semiconductor apparatus of the first embodiment except that either the first lattice layers 31 or the second lattice layers 32 in the SLS buffer layer 30 are doped with impurities.

In a specific example of the present embodiment, as illustrated in FIG. 8, GaN layers as the second lattice layers 32 in the SLS buffer layer 30 are doped with impurities such as Fe, Mg and C, while AlN layers as the first lattice layers 31 are not doped with such impurities. In general, the generation of electrons that are carriers due to band discontinuities between the first lattice layers 31 and the second lattice layers 32 occurs in the vicinity of the interfaces of the second lattice layers 32 which are GaN layers having narrow band gap. Thus, doping of the second lattice layers 32 with impurities such as Fe, Mg and C makes it possible to increase resistance efficiently while maximally reducing a decrease in crystallinity. A preferred doping method is to dope the entirety of the second lattice layer 32 with impurities such as Fe, Mg and C, or to dope regions of the second lattice layer 32 in the vicinity of the interfaces with the first lattice layers 31 with impurities such as Fe, Mg and C.

The concentration of dopant impurities such as Fe, Mg and C in the second lattice layers 32 is preferably $1\times10^{18}$ cm$^{-3}$ to $1\times10^{20}$ cm$^{-3}$. In the present embodiment, the second lattice layers 32 are doped with $1\times10^{19}$ cm$^{-3}$ of Fe as the impurity.

Other configurations are similar to those in the first embodiment.

Third Embodiment

Next, a third embodiment will be described. The present embodiment is drawn to semiconductor devices, power supply units and high-frequency amplifiers.

Figure 9:
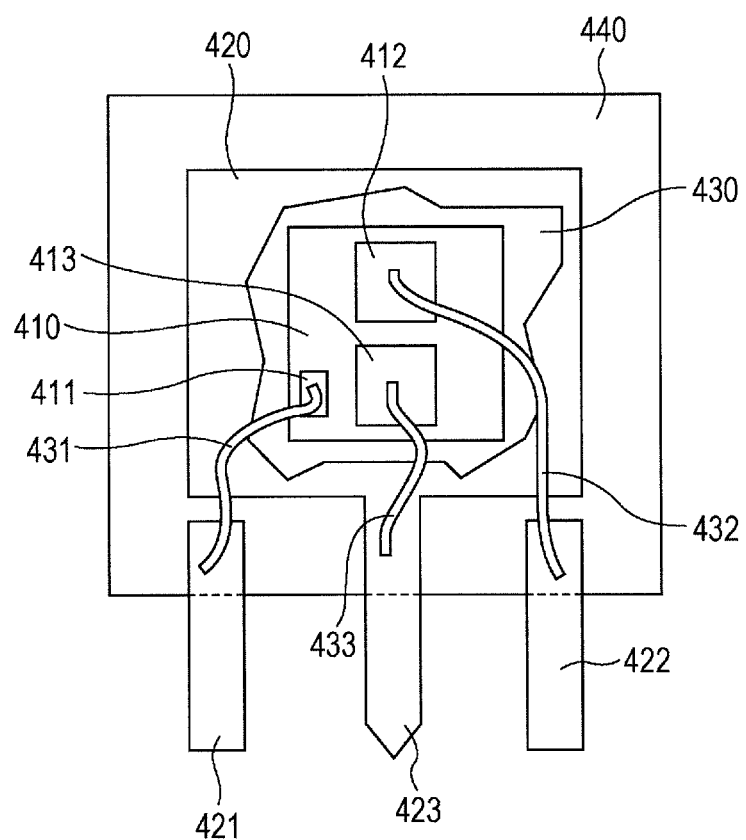
FIG. 9 is a view illustrating a discretely packaged semiconductor device in a third embodiment.

A semiconductor device in the present embodiment is a discrete package of the semiconductor apparatus according to the first embodiment or the second embodiment. Such a discretely packaged semiconductor device will be described with reference to FIG. 9. FIG. 9 schematically illustrates an internal configuration of a discretely packaged semiconductor device, and the arrangement of electrodes and the like may differ from those described in the first embodiment or the second embodiment.

First, the semiconductor apparatus manufactured in the first embodiment or the second embodiment is cut by dicing or the like to form a HEMT semiconductor chip 410 made of a GaN semiconductor material. The semiconductor chip 410 is fixed onto a lead frame 420 with a die-attach adhesive 430 such as solder. The semiconductor chip 410 corresponds to the semiconductor apparatus in the first embodiment or the second embodiment.

Next, a gate electrode 411 is connected to a gate lead 421 with a bonding wire 431; a source electrode 412 is connected to a source lead 422 with a bonding wire 432; and a drain electrode 413 is connected to a drain lead 423 with a bonding wire 433. The bonding wires 431, 432 and 433 are formed of a metal material such as Al. In the present embodiment, the gate electrode 411 is a gate electrode pad, and is connected to the gate electrode 51 of the semiconductor apparatus according to the first embodiment or the second embodiment. Further, the source electrode 412 is a source electrode pad, and is connected to the source electrode 52 of the semiconductor apparatus according to the first embodiment or the second embodiment. Furthermore, the drain electrode 413 is a drain electrode pad, and is connected to the drain electrode 53 of the semiconductor apparatus according to the first embodiment or the second embodiment.

Next, the unit obtained above is sealed with a mold resin 440 by a transfer molding method. In this manner, a discretely packaged HEMT semiconductor device utilizing a GaN semiconductor material may be manufactured.

Next, power supply units and high-frequency amplifiers in the present embodiment will be described. The power supply units and the high-frequency amplifiers in the present embodiment include the semiconductor apparatuses according to the first embodiment or the second embodiment.

Figure 10:
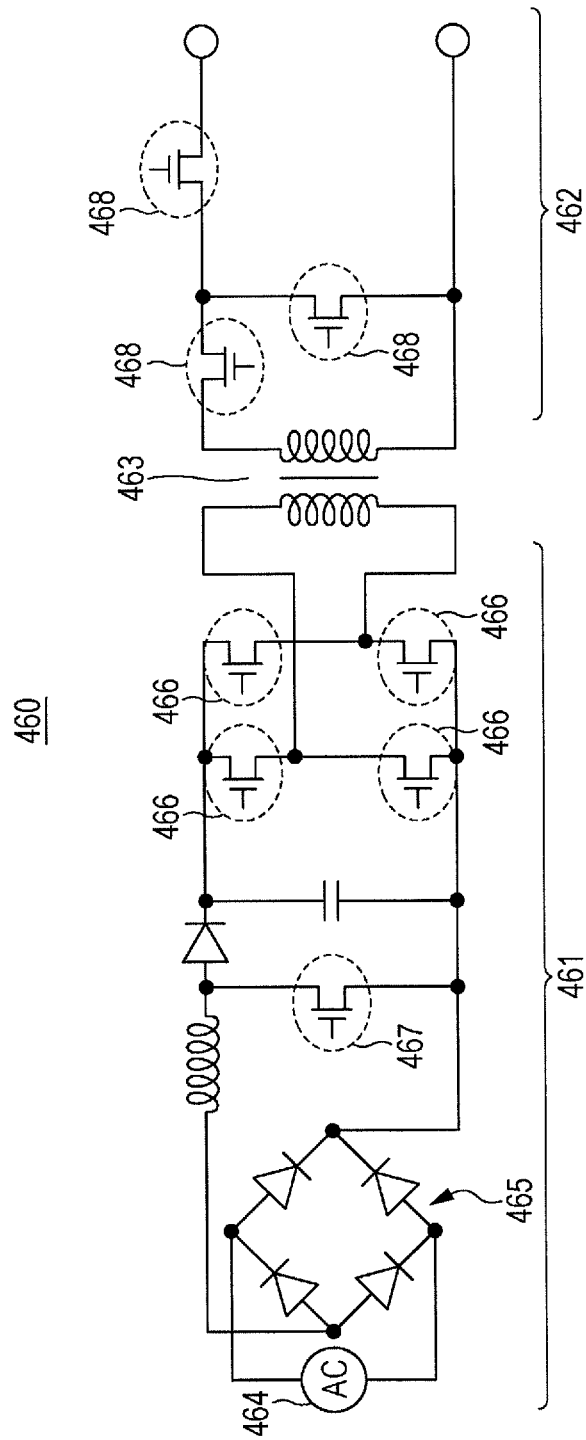
FIG. 10 is a view illustrating a circuit of a power supply unit in the third embodiment.

First, a power supply unit in the present embodiment will be described with reference to FIG. 10. A power supply unit 460 in the present embodiment includes a high-voltage primary circuit 461, a low-voltage secondary circuit 462, and a transformer 463 disposed between the primary circuit 461 and the secondary circuit 462. The primary circuit 461 includes an alternating current power supply 464, a so-called bridge rectifier circuit 465, a plurality of switching elements (four in the example illustrated in FIG. 10) 466, and a switching element 467. The secondary circuit 462 includes a plurality of switching elements (three in the example illustrated in FIG. 10) 468. In the example illustrated in FIG. 10, the semiconductor apparatuses according to the first embodiment or the second embodiment are used as the switching elements 466 and 467 of the primary circuit 461. It is preferable that the switching elements 466 and 467 of the primary circuit 461 be normally-off semiconductor apparatuses. The switching elements 468 in the secondary circuit 462 utilize usual metal insulator semiconductor field effect transistors (MISFETs) formed of silicon.

Figure 11:
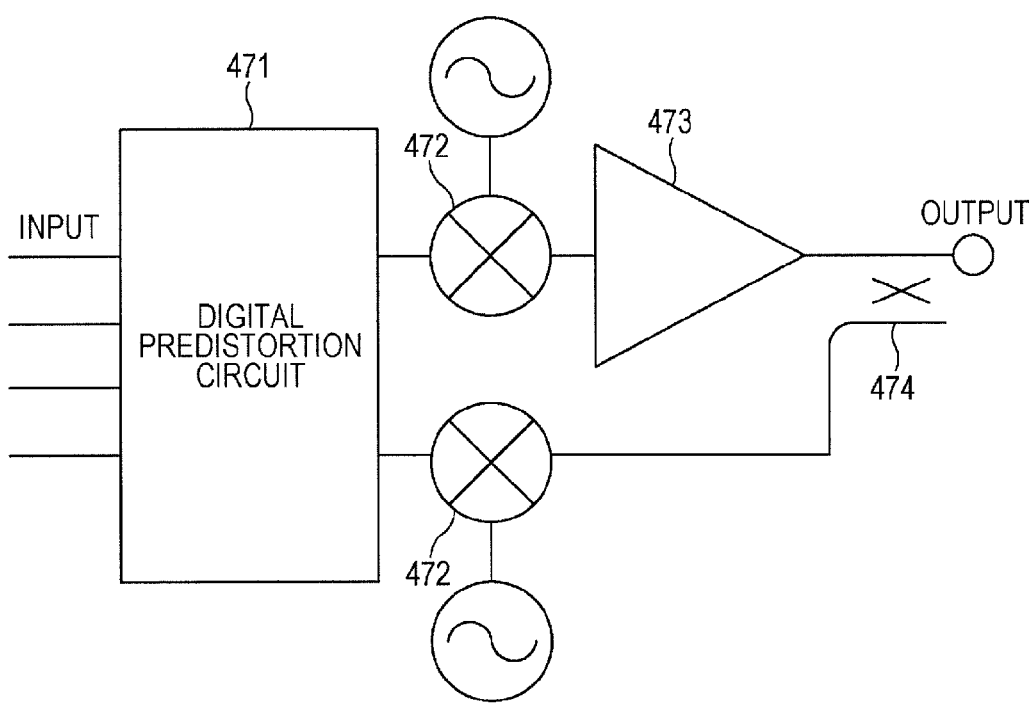
FIG. 11 is a view illustrating a structure of a high-frequency amplifier in the third embodiment.

Next, a high-frequency amplifier in the present embodiment will be described with reference to FIG. 11. A high-frequency amplifier 470 in the present embodiment may be applied as, for example, a power amplifier for a mobile phone base station. The high-frequency amplifier 470 includes a digital predistortion circuit 471, mixers 472, a power amplifier 473, and a directional coupler 474. The digital predistortion circuit 471 is configured to compensate for non-linear strain of an input signal. The mixer 472 is configured to mix the input signal of which non-linear strain has been compensated for with an alternating current signal. The power amplifier 473 is configured to amplify the input signal mixed with the alternating current signal. In the example illustrated in FIG. 11, the power amplifier 473 has the semiconductor apparatus according to the first embodiment or the second embodiment. The directional coupler 474 is configured to, for example, monitor the input signal and the output signal. In the circuit illustrated in FIG. 11, switching of a switch or the like makes it possible for the output signal to be mixed with an alternating current signal at the mixer 472 and for the mixed signal to be supplied to the digital predistortion circuit 471.

Although some embodiments are described hereinabove, these embodiments are only illustrative, and various modifications and changes are possible within the claimed scope.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
a substrate;
a buffer layer formed on the substrate;
a strained layer superlattice buffer layer formed on the buffer layer;
an electron transit layer formed of a semiconductor material on the strained layer superlattice buffer layer; and
an electron supply layer formed of a semiconductor material on the electron transit layer;
the strained layer superlattice buffer layer being an alternate stack of first lattice layers including AlN and second lattice layers including GaN;
the strained layer superlattice buffer layer being doped with one, or two or more impurities selected from Fe, Mg and C,
wherein a thickness of the second lattice layer is not less than 10 nm,
wherein a thickness of the strained layer superlattice buffer layer is not less than 1000 nm,
wherein the buffer layer further comprises three layers having different Al compositions.

2. The semiconductor apparatus according to claim 1, wherein a concentration of the impurity or impurities is $1\times10^{18}$ cm$^{-3}$ to $1\times10^{20}$ cm$^{-3}$.

3. The semiconductor apparatus according to claim 1, wherein a relationship R>S is satisfied provided that a composition of the first lattice layers is $Al_R Ga_{1-R}N$ and a composition of the second lattice layers is $Al_S Ga_{1-S}N$.

4. The semiconductor apparatus according to claim 1, wherein the first lattice layers are formed of AlN, and the second lattice layers are formed of GaN.

5. The semiconductor apparatus according to claim 1, wherein a thickness of the first lattice layer is not less than 0.5 nm and not more than 10 nm, and
a thickness of the second lattice layer is not less than 10 nm and not more than 40 nm.

6. The semiconductor apparatus according to claim 1, wherein a ratio of a thickness of the second lattice layer to a thickness of the first lattice layer is not less than 4 and not more than 20.

7. The semiconductor apparatus according to claim 1, wherein a thickness of the strained layer superlattice buffer layer is not less than 1000 nm and not more than 3000 nm.

8. The semiconductor apparatus according to claim 1, wherein the buffer layer is formed of AlGaN.

9. The semiconductor apparatus according to claim 8, wherein an Al composition in the buffer layer is not less than an effective Al composition in the strained layer superlattice buffer layer.

10. The semiconductor apparatus according to claim 1, wherein the semiconductor apparatus further comprises a nucleation layer formed between the substrate and the buffer layer; and
the nucleation layer is formed of AlN.

11. The semiconductor apparatus according to claim 1, wherein the substrate is a silicon substrate.

12. The semiconductor apparatus according to claim 1, wherein the buffer layer, the strained layer superlattice buffer layer, the electron transit layer and the electron supply layer are layers formed by metal organic vapor phase epitaxy (MOVPE).

13. The semiconductor apparatus according to claim 1, wherein the electron transit layer is formed of a material including GaN.

14. The semiconductor apparatus according to claim 1, wherein the electron supply layer is formed of a material including AlGaN.

15. The semiconductor apparatus according to claim 1, wherein the semiconductor apparatus further comprises a gate electrode, a source electrode and a drain electrode, the gate electrode, the source electrode and the drain electrode being formed on the electron supply layer.

16. The semiconductor apparatus according to claim 1, wherein the semiconductor apparatus further comprises a cap layer formed on the electron supply layer; and
the cap layer is formed of a material including n-GaN.

17. A power supply unit comprising the semiconductor apparatus described in claim 1.

18. An amplifier comprising the semiconductor apparatus described in claim 1.

19. A semiconductor apparatus comprising:
a substrate;
a buffer layer formed on the substrate;
a strained layer superlattice buffer layer formed on the buffer layer;
an electron transit layer formed of a semiconductor material on the strained layer superlattice buffer layer; and
an electron supply layer formed of a semiconductor material on the electron transit layer;
the strained layer superlattice buffer layer being an alternate stack of first lattice layers including MN and second lattice layers including GaN;
either the first lattice layers or the second lattice layers being doped with one, or two or more impurities selected from Fe, Mg and C,
wherein a thickness of the second lattice layer is not less than 10 nm,
wherein a thickness of the strained layer superlattice buffer layer is not less than 1000 nm,
wherein the buffer layer further comprises a plurality of layers having different Al compositions, wherein the Al compositions in the buffer layer decrease with increasing distance from the substrate.

20. The semiconductor apparatus according to claim 19, wherein the second lattice layers are doped with the impurity or impurities.

* * * * *